(12) United States Patent
Adan

(10) Patent No.: US 6,982,477 B2
(45) Date of Patent: Jan. 3, 2006

(54) INTEGRATED CIRCUIT

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/815,952

(22) Filed: Apr. 2, 2004

(65) Prior Publication Data

US 2004/0195692 A1 Oct. 7, 2004

(30) Foreign Application Priority Data

Apr. 4, 2003 (JP) .............................. 2003-102118

(51) Int. Cl.
*H01L 29/72* (2006.01)
(52) U.S. Cl. ...................... 257/659; 257/208; 257/211; 257/508; 257/660; 257/662; 257/758
(58) Field of Classification Search ................ 257/208, 257/211, 508, 659, 660, 662, 758
See application file for complete search history.

(56) References Cited

U.S. PATENT DOCUMENTS 6,307,252 B1 * 10/2001 Knoedl, Jr. ................. 257/659

FOREIGN PATENT DOCUMENTS

JP 10-256250 9/1998

OTHER PUBLICATIONS

"On-Chip Spiral Inductors with Patterned Ground Shields for Si-Based RF IC's" [C. Patrick Yue et al., IEEE Journal of Solid-State Circuits, vol. 33, No. 5, pp. 743-752, Mary 1998].

"Deep Trench Guard Technology to Suppress Coupling between Inductors in Silicon RF ICs" [Cheon Soo Kimm et al., 20011 IEEE].

"Future EMC Trends in PC Board Design" [Bruce Gabrielson, EMC EXPO 1996, Jun. 16 to 19, 1996].

* cited by examiner

*Primary Examiner*—Edward Wojciechowicz
(74) *Attorney, Agent, or Firm*—Nixon & Vanderhye P.C.

(57) ABSTRACT

A lamination of metal wire layers forms an electromagnetic isolation structure. The metal wire layers are connected with each other by vias, so that a metal fence having a laminated structure is formed. The metal fence is provided so as to surround an element (e.g. a spiral inductor) that generates an electromagnetic field in an integrated circuit. The metal wire satisfies $d \leq \lambda/8$, $WF \geq 5\delta$, and $L \leq \lambda/20$, where $\delta$ is a skin depth of an electromagnetic wave, c is a velocity of light, f is an operating frequency of the integrated circuit, d is a lateral-direction size of a metal-fence region, WF is a surrounding-line width of the metal fence, L is an interval between the vias, and $\lambda = c/f$ is a wavelength of a signal. With this arrangement, it is possible to decrease electromagnetic coupling noises and coupling noises caused via the substrate.

17 Claims, 14 Drawing Sheets

FIG. 6

| FIRST METAL LAYER | SECOND METAL LAYER | THIRD METAL LAYER | FOURTH METAL LAYER | MAXIMUM VALUE OF S21[dB] |
|---|---|---|---|---|
|  |  |  |  | -20 |
|  |  |  | A | -30 |
|  |  | A | A | -35 |
|  | A | A | A | -42 |
| A | A | A | A | -42 |
| B |  |  |  | -24 |
| B | B |  |  | -27 |
| B | B | B |  | -36 |

INTEGRATED CIRCUIT

This nonprovisional application claims priority under 35 U.S.C. § 119(a) on Patent Application No. 2003/102118 filed in Japan on Apr. 4, 2003, the entire contents of which are hereby incorporated by reference.

FIELD OF THE INVENTION

The present invention relates to an integrated circuit, and especially relates to an integrated circuit that requires consideration of electromagnetic coupling in an RF frequency domain.

BACKGROUND OF THE INVENTION

A system-on chip (SOC) is an integrated circuit including, within a single chip, a plurality of circuits for digital signals, analog signals, and high-frequency waves. As shown in FIG. 11, device properties are deteriorated by interactions between circuit blocks, especially by digital switching noises coupled with analog circuits and RF circuits via a silicon substrate. In a field of CMOS-hybrid-device design, it is a well-known measure to use a deep N–well in order to decrease coupling of the digital switching noises via the substrate. However, in case the RF circuits are integrated within a single chip, interference between RF circuit blocks (electric coupling via the substrate and magnetic coupling over the substrate) needs to be considered. When a frequency in use is increased, RF coupling becomes stronger, accordingly. Moreover, an RF passive element having a large area, such as a spiral inductor, is easily coupled with the silicon substrate and an adjacent device. For example, if an input of a low noise amplifier (LNA) is coupled with a VCO that operates at a 1.5 GHz-RF frequency, sensitivity for detecting an antenna signal (usually several micro volts) is decreased due to a high-voltage signal (typically up to one volt) of the VCO.

In order to reduce influences of the coupling between RF devices, such as spiral inductor-spiral inductor coupling, the following technologies are proposed:
(1) Creating a large space between interfering devices;
(2) Providing patterned ground shield layers below spiral inductors ("On-Chip Spiral Inductors with Patterned Ground Shields for Si-Based RF IC's", *IEEE Journal of Solid-State Circuits*, Vol. 33, No. 5, May 1998, pp. 743–752) (hereinafter "non-patent publication 1");
(3) Deep trench guard technology ("Deep Trench Guard Technology to Suppress Coupling between Inductors in Silicon RF ICs", 2001 IEEE) (hereinafter "non-patent publication 2");
(4) Metal wire shield technology in which signal lines are surrounded at least on three sides by faraday cage (U.S. Pat. No. 6,307,252 (date of patent: Oct. 23, 2001)) (hereinafter "patent publication 1");
(5) Metal cage shield technology in which metal wires are surrounded (Japanese Publication for Unexamined Patent Publication, Tokukaihei 10-256250 (publication date: Sep. 25, 1998)) (hereinafter "patent publication 2").

An object of the foregoing technologies is to decrease capacitive coupling between a circuit block and a metal connection line by means of metal shield structures. The shield structures are connected with a GND. These conventional structures (EMC EXPO 1996) are similar to a technology (in which circuits are isolated from each other and EMI is decreased) used essentially for a PCB, "Future EMC Trends in PC Board Design", Jun. 16 to 19, 1986, EMC EXPO 1996, available via Internet <URL: http://www.blackmagic.com/ses/bruceg/EMC/futurePCB.html> (hereinafter "non-patent publication 3").

However, the foregoing methods have the following problems.

If a large space is created between interfering devices, a chip size and costs are increased.

If patterned GND shields are provided below the spiral inductors, a Q factor of the spiral inductors is decreased. Moreover, this technology is effective in an RF frequency band (coupling reduction via the substrate), but is not effective in reducing electromagnetic coupling (magnetic coupling over the substrate).

The technology of the non-patent publication 2 is not compatible with a normal CMOS process, and is therefore expensive.

The technology of the patent publication 1 prevents noises in metal wires. Therefore, although metal wires are shielded by the technologies of the patent publications 1 and 2, pick-up noises and coupling noises that are transmitted from the silicon substrate or via the silicon substrate cannot be suppressed.

Furthermore, none of the foregoing technologies deal with interactions with active transistors that are such as to amplify the coupling. For example, FIG. 12 illustrates a test pattern including (i) a spiral inductor and (ii) transistors provided adjacent to the spiral inductor. When a signal is supplied to the spiral inductor, ideally a signal measured at drains of the transistors should be zero, without any coupling.

However, as is clear from FIG. 13, a relationship between (i) an input-output connectivity (S21) and (ii) a frequency clearly indicates an occurrence of coupling. From FIG. 13, it is found that the input-output connectivity increases in a high-frequency domain even when the transistors are OFF (Id=0), due to coupling caused by paths in the substrate.

On the other hand, if the transistors are ON, signals are transferred due to electromagnetic coupling between the spiral inductor and gate lines of the transistors.

In hybrid-signal ICs, the deep N–well technology is generally used in order to decrease digital noise coupling that occurs via the silicon substrate. Thus, the deep N–well technology is used in the structure of the spiral inductor and the transistors shown in FIG. 12. The deep N–well technology has an effect of decreasing a value of the S21 by approximately 5 dB, but is still insufficient for a severe applied device such as an RF LNA.

SUMMARY OF THE INVENTION

An object of the present invention is therefore to provide an integrated circuit that is compatible with a standard IC process, and that can decrease electromagnetic coupling noises and coupling noises caused via the substrate.

In order to attain the foregoing object, an integrated circuit of the present invention includes a target element; and a metal fence provided so as to surround the target element, the metal fence including (i) a lamination of metal wire layers for forming an electromagnetic isolation structure and (ii) a plurality of vias for connecting the metal wire layers with each other, the metal fence satisfying $d \leq \lambda/8$, $WF \geq 5\delta$, and $L \leq \lambda/20$, where δ is a skin depth of an electromagnetic wave, c is a velocity of light, f is an operating frequency of the integrated circuit, d is a lateral-direction size of a metal-fence region, WF is a surrounding-line width of the metal fence, L is an interval between the vias, and λ=c/f is a wavelength of a signal.

With this arrangement, relationships among δ (the skin depth of an electromagnetic wave), d (the lateral-direction size of a metal-fence region), WF (the surrounding-line width of the metal fence), L (the interval between the vias), and λ (the wavelength of a signal) are determined.

As a result, it is possible to decrease electromagnetic coupling noises and coupling noises caused via the substrate.

In addition to the foregoing arrangement, the integrated circuit of the present invention includes a guard ring provided right under the metal fence, the guard ring being made of a first diffusion layer whose conductivity type is identical to a conductivity type of a substrate, the guard ring being connected with a fixed potential, the guard ring being electrically isolated from the metal fence.

In this arrangement, (i) the guard ring, which is made of the first diffusion layer whose conductivity type is identical to the conductivity type of the substrate, is provided right under the metal fence, (ii) the guard ring is connected with a fixed potential, and (iii) the guard ring is electrically isolated from the metal fence. Therefore, in addition to an effect of the foregoing arrangement, it is possible to more effectively decrease the electromagnetic coupling noises and the coupling noises caused via the substrate.

In addition to the foregoing arrangement, the integrated circuit of the present invention includes a well provided below the target element, the well being connected with a substrate.

In this arrangement, the well provided below the target element is connected with the substrate. Therefore, in addition to the effect of the foregoing arrangement, it is possible to more effectively decrease the electromagnetic coupling noises and the coupling noises caused via the substrate.

In addition to the foregoing arrangement, the integrated circuit of the present invention includes a low-resistance layer provided below the target element, a conductivity type of the low-resistance layer being identical to a conductivity type of a substrate, the low-resistance layer being connected with a fixed potential, the low-resistance layer being electrically isolated from the metal fence.

In addition to the foregoing arrangement, in the integrated circuit of the present invention, an area of the low-resistance layer is equivalent to an area surrounded by the metal fence.

Therefore, in addition to the effect of the foregoing arrangement, it is possible to more effectively decrease the electromagnetic coupling noises and the coupling noises caused via the substrate.

In addition to the foregoing arrangement, in the integrated circuit of the present invention, the low-resistance layer is a salicide diffusion layer.

In this arrangement, the low-resistance layer is the salicide diffusion layer. Therefore, in addition to the effect of the foregoing arrangement, it is possible to more effectively decrease the electromagnetic coupling noises and the coupling noises caused via the substrate.

In addition to the foregoing arrangement, in the integrated circuit of the present invention, the low-resistance layer is a silicidized polysilicon layer.

In this arrangement, the low-resistance layer is the silicidized polysilicon layer. Therefore, in addition to the effect of the foregoing arrangement, it is possible to more effectively decrease the electromagnetic coupling noises and the coupling noises caused via the substrate.

In addition to the foregoing arrangement, in the integrated circuit of the present invention, between a plurality of elements each of which has the metal fence is a substrate.

In this arrangement, between the plurality of elements each of which has the metal fence is the substrate. That is, no diffusion layer is provided between the plurality of elements. Therefore, in addition to the effect of the foregoing arrangement, it is possible to more effectively decrease, without requiring a diffusion layer, the electromagnetic coupling noises and the coupling noises caused via the substrate.

In addition to the foregoing arrangement, in the integrated circuit of the present invention, between an element having the metal fence and another element having no metal fence is a substrate.

In this arrangement, between the element having the metal fence and the another element having no metal fence is the substrate. That is, no diffusion layer is provided between the element having the metal fence and the another element having no metal fence. Therefore, in addition to the effect of the foregoing arrangement, it is possible to more effectively decrease, without requiring a diffusion layer, the electromagnetic coupling noises and the coupling noises caused via the substrate.

For a fuller understanding of the nature and advantages of the invention, reference should be made to the ensuing detailed description taken in conjunction with the accompanying drawings.

BRIEF DESCRIPTION OF THE DRAWINGS

FIG. 6 is a figure illustrating the input-output connectivity S21.

DESCRIPTION OF THE EMBODIMENTS

With reference to FIGS. 1 to 10, the following describes one embodiment of the present invention.

The present invention relates to electromagnetic isolation of a circuit block in an integrated circuit. In particular, the present invention proposes an electromagnetic isolation structure that is more effective for decreasing electromagnetic coupling in an RF frequency domain. The structure is effective for a standard CMOS, BiCMOS, or bipolar process. All the following structures can prevent the electromagnetic coupling in the high-frequency domain and substrate crosstalk. Here, each circuit block is a high-frequency device that is an element (a target element) generating an electromagnetic field in the integrated circuit. For example, the circuit block is a passive member such as a spiral inductor.

In an arrangement of the present embodiment, electromagnetic coupling between circuit blocks and between (i) a circuit block and (ii) interconnecting wires are prevented by using a grounded metal fence. The metal fence is entirely an electric conductor, and can be connected to a fixed (constant) potential such as a Vdd or a GND by using a metal wire. The metal fence is a lamination of metal wire layers. The metal wire layers are connected with each other by vias. The metal fence completely or partially surrounds the circuit block. The coupling at a high frequency via the substrate is suppressed by shield layers (e.g. P+, N+, and N-well diffusion layers). A deep N-well may be used in combination with the metal fence, in order to suppress back-gate coupling of transistors.

All the following structures can be manufactured by a well-known, generally used Si-IC process. Therefore, description of manufacturing steps is omitted. Thus, the present invention does not require any additional process or any process alternation. The structures of the present invention are made by accurately forming the metal wire layers and diffusion layers in an elaborately designed pattern in the normal IC process.

Details of the electromagnetic isolation structure are described below. In the following, a four-layer metal process is described as one example. Needless to say, the number of the metal wire layers is not limited to four.

Figure 1:
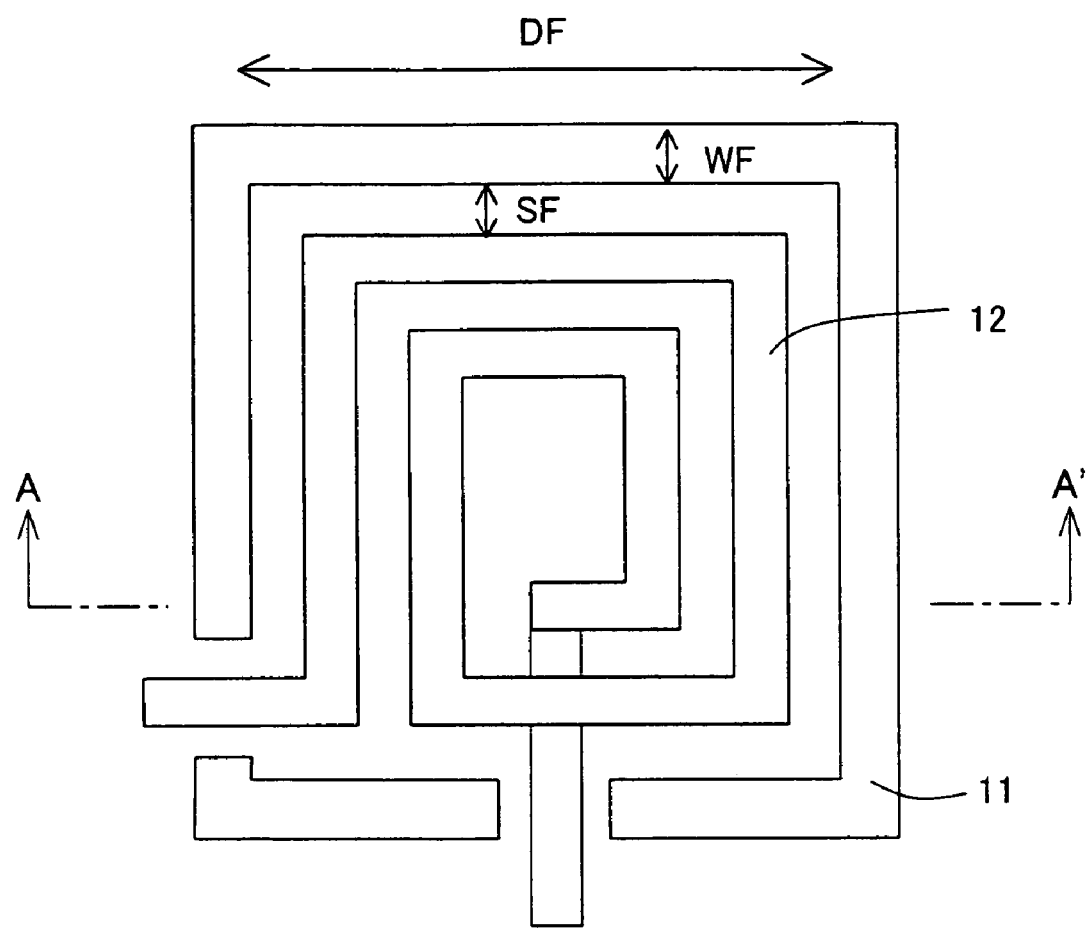
FIG. 1 is a plan view illustrating one example of an arrangement of a metal fence in an integrated circuit of the present invention.
Figure 2:
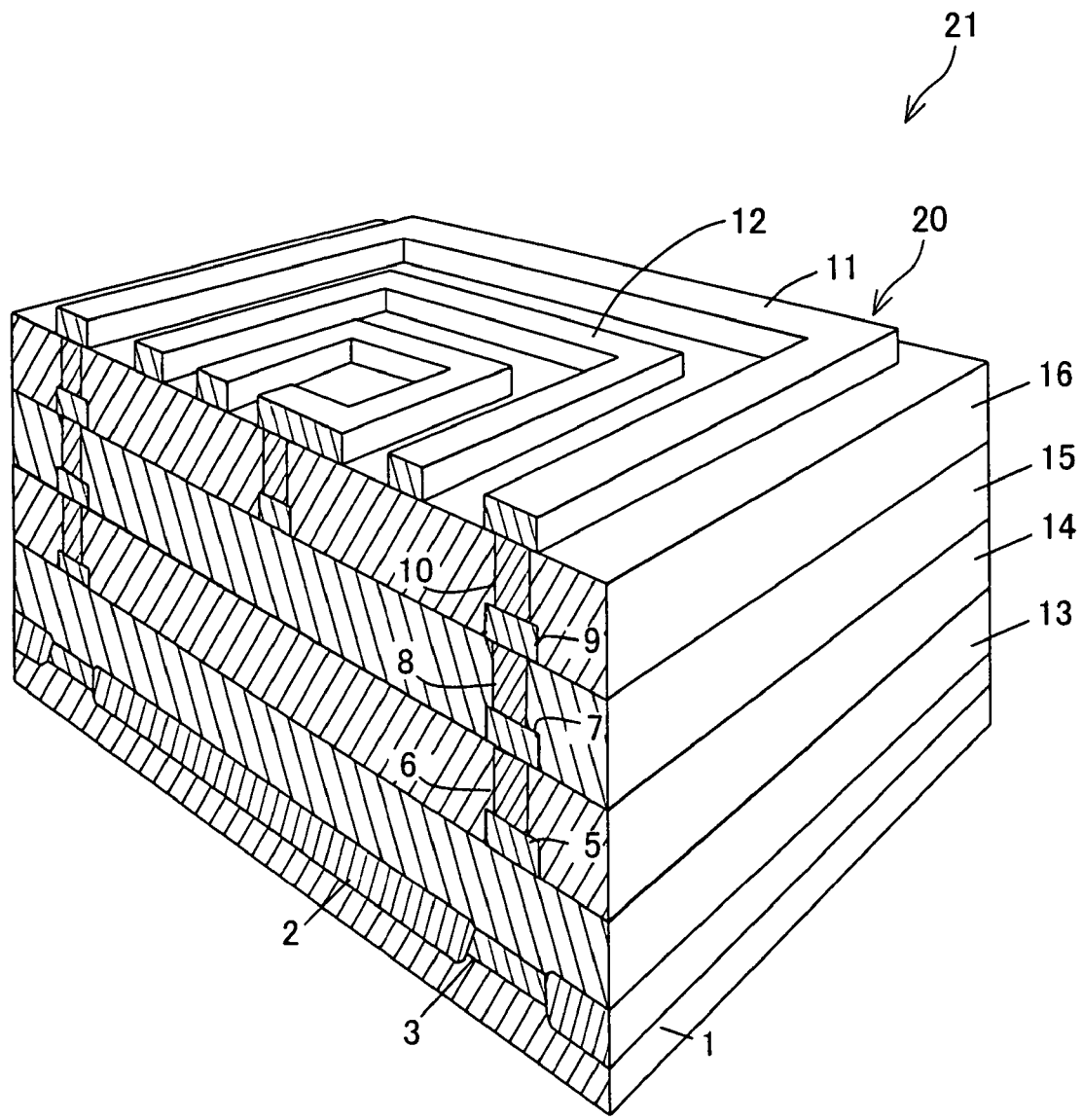
FIG. 2 is a perspective view including a cross-section taken along line A–A', the perspective view illustrating the arrangement of FIG. 1.
Figure 3:
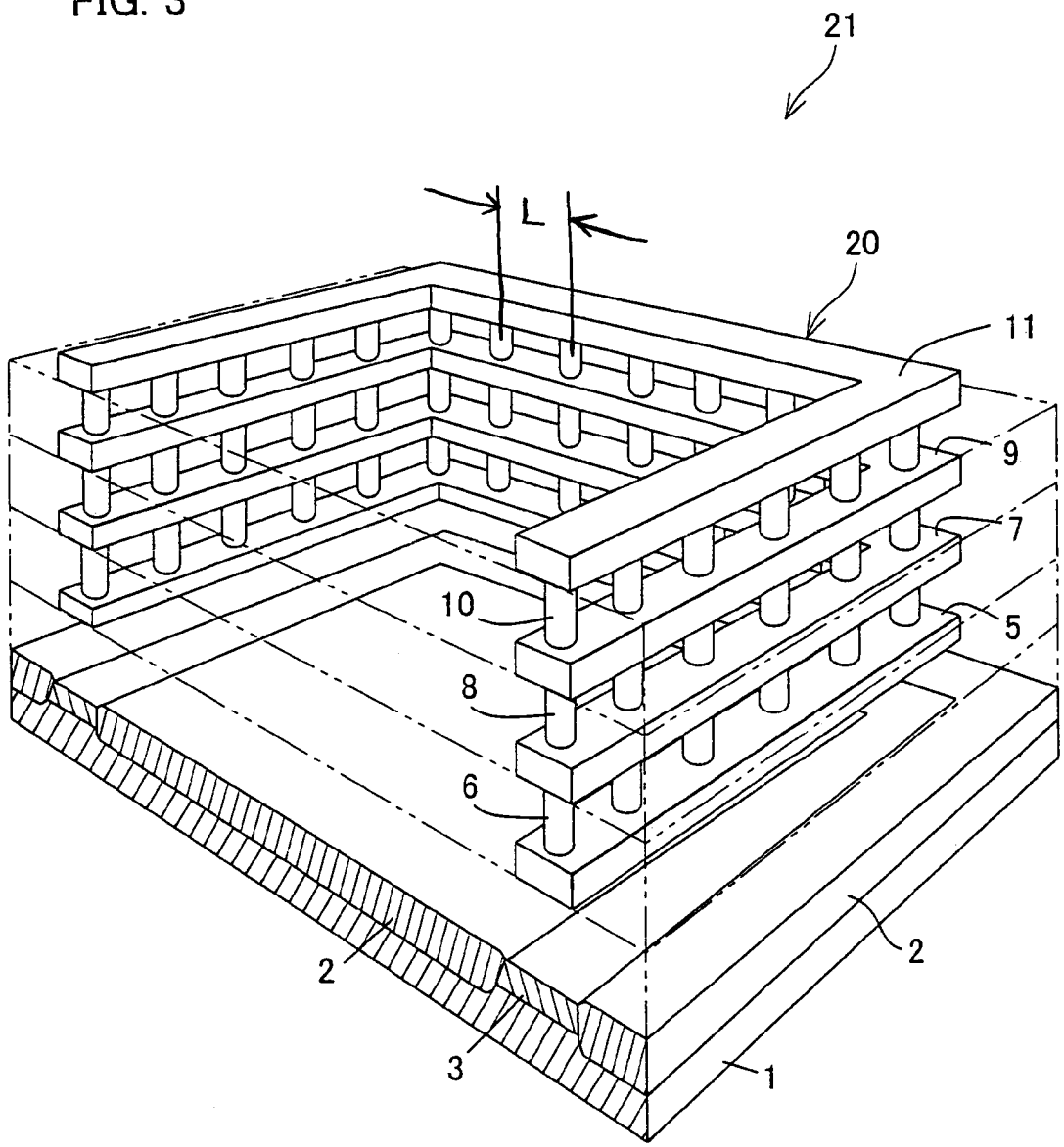
FIG. 3 is a perspective view illustrating the arrangement of FIG. 1.

FIGS. 1 and 2 illustrate an electromagnetic metal fence 20 surrounding a spiral inductor in an integrated circuit 21 of the present invention. FIG. 3 illustrates details of a metal fence structure, which is one aspect of the present invention. In FIG. 3, a guard ring 3 (a first diffusion layer) is provided right under the metal fence, that is, under the metal fence and at a vertically same position as the metal fence. The guard ring 3 is a diffusion layer whose conductivity type is identical to that of a silicon substrate 1. The metal fence is used as a lamination of metal wire layers 5, 7, 9, and 11, and functions simultaneously with the guard ring 3. In FIG. 3, "2" is an element isolation region 2. The element isolation region 2 is an element isolator generally used in an Si process in which $SiO_2$ is used.

The metal fence 20 includes the lamination of metal wire layers, which are connected in a vertical direction with each other by vias 6, 8, and 10. The metal fence 20 entirely or partially surrounds the circuit block.

In FIG. 2, the metal fence 20 surrounds a spiral inductor 12.

It is important that a distance SF (see FIG. 1) between the metal fence and the spiral inductor 12 (the circuit block) is determined so as not to change an electric property of the circuit block (In FIG. 2, the spiral inductor 12) surrounded by the metal fence. Therefore, it is necessary that the distance SF is determined in accordance with an application. Typically, SF>25 μm. A width WF of the metal fence is determined so that a resistance of the metal fence becomes low, and that an influence of an electromagnetic field is sufficiently decreased. Effectiveness of the metal fence for suppressing electromagnetic coupling depends on the width WF of the metal fence and an interval between the vias in a laminated structure.

Basically, a skin depth (that indicate how deep an electromagnetic field reaches) is δ. That is, δ is a skin depth of an electromagnetic wave, i.e. a maximum depth (from a surface of the integrated circuit) for an occurrence of electromagnetic coupling. Here, assuming that $$\delta = \{\rho/(\pi\mu f)\}^{1/2}$$

where ρ is a resistivity of the metal wire, μ is a magnetic permeability, and f is an operating frequency 1 GHz to 5 GHz); and $$\lambda = c/f$$

where λ is a wavelength of a fastest signal in the circuit, and c is a velocity of light, the electromagnetic coupling has virtually no influence if the following conditions are satisfied:

the width WF of the metal fence $\geq 5\delta$; and
the interval between the vias $\leq \lambda/20$.

As a typical value, WF>5 μm is adopted in case a material of the metal fence is AlCu, and a thickness of each metal wire layer of the metal fence is 0.6 μm to 1.5 μm. Other than AlCu, what may be used are, for example, AlSi, Al, Au, Cu, and the like.

Figure 4:
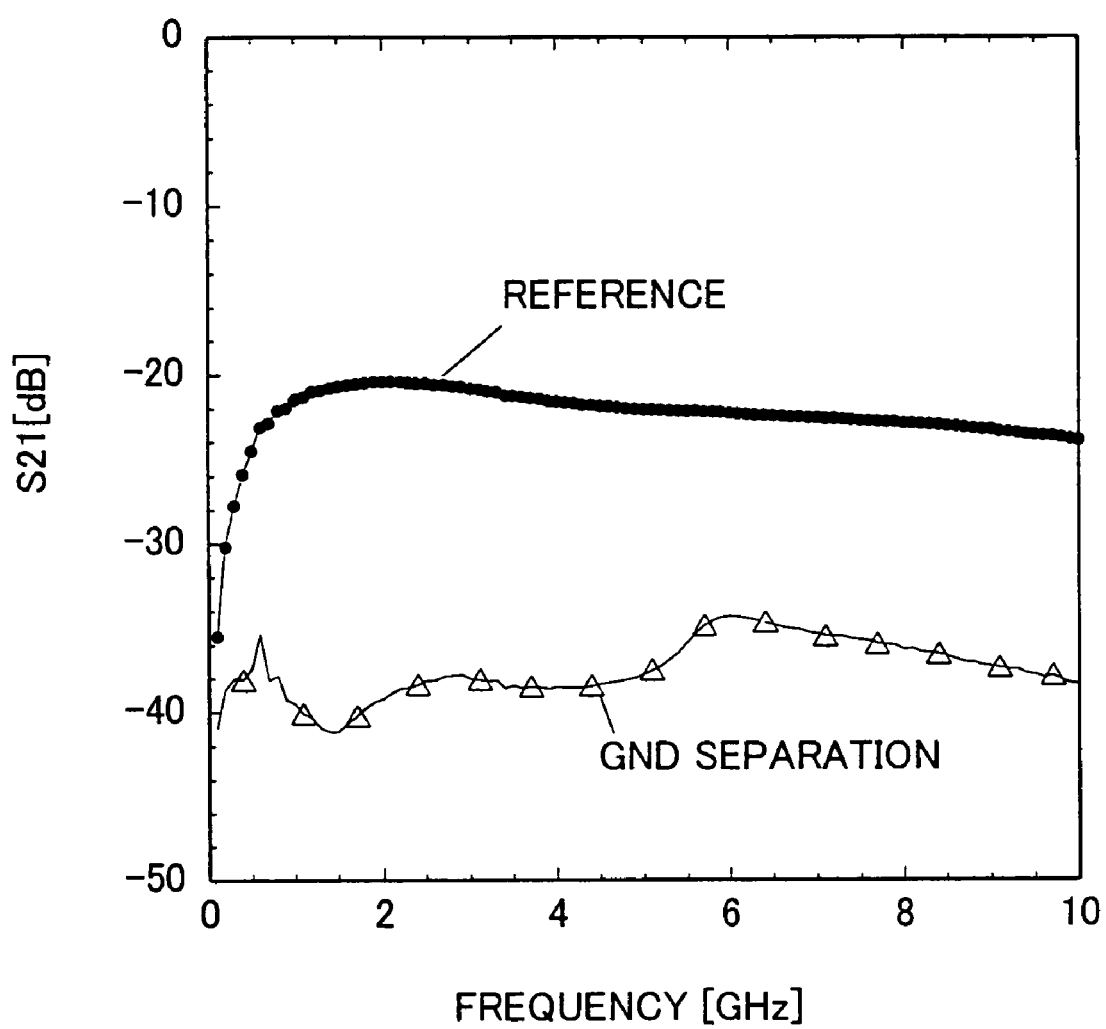
FIG. 4 is a graph illustrating a relationship between an input-output connectivity S21 and a frequency.
Figure 12:
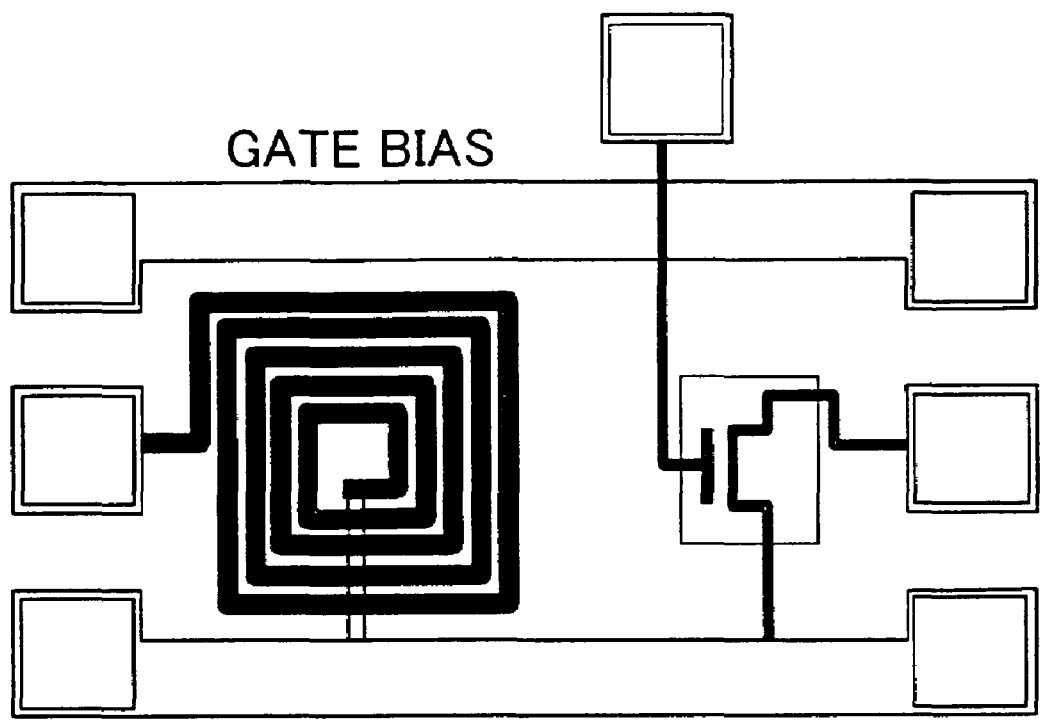
FIG. 12 is a plan view illustrating a test pattern.
Figure 13:
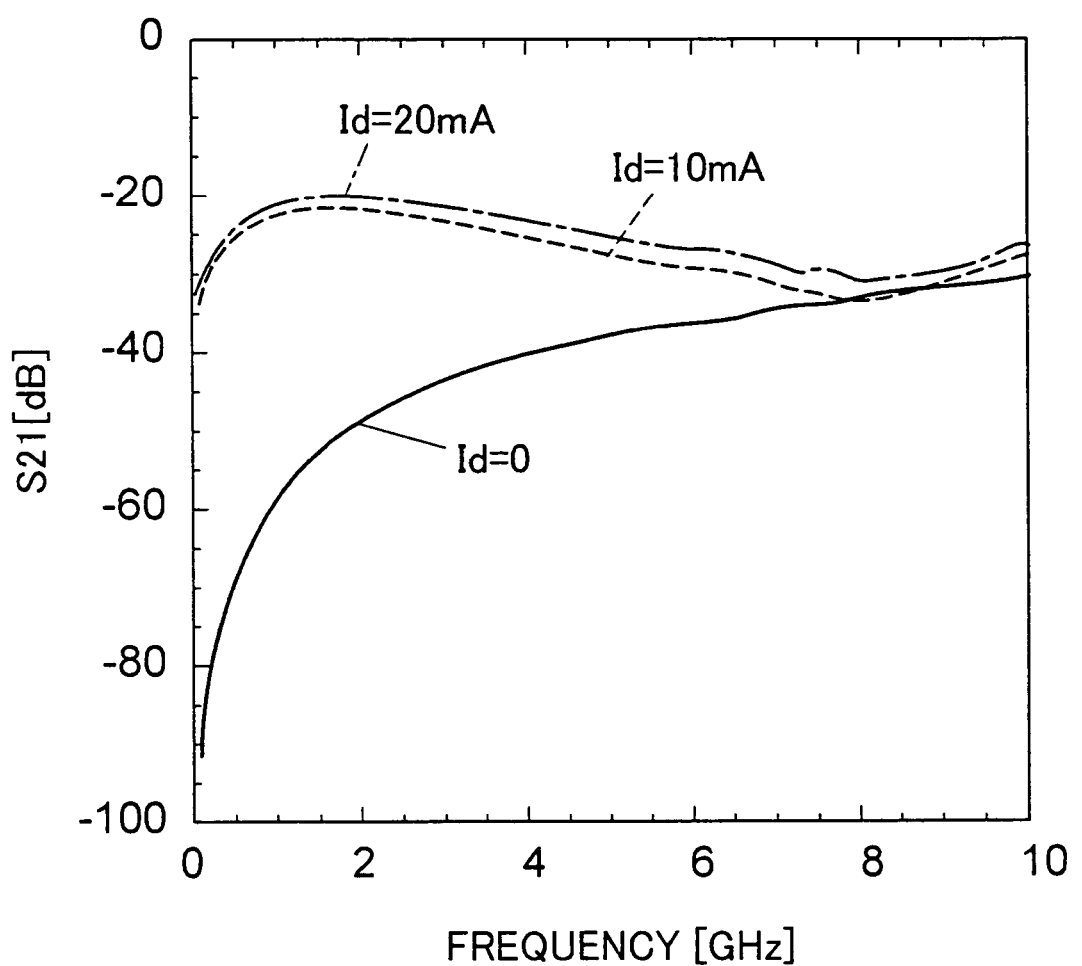
FIG. 13 is a graph illustrating how the input-output connectivity S21 depends on the frequency.
Figure 14:
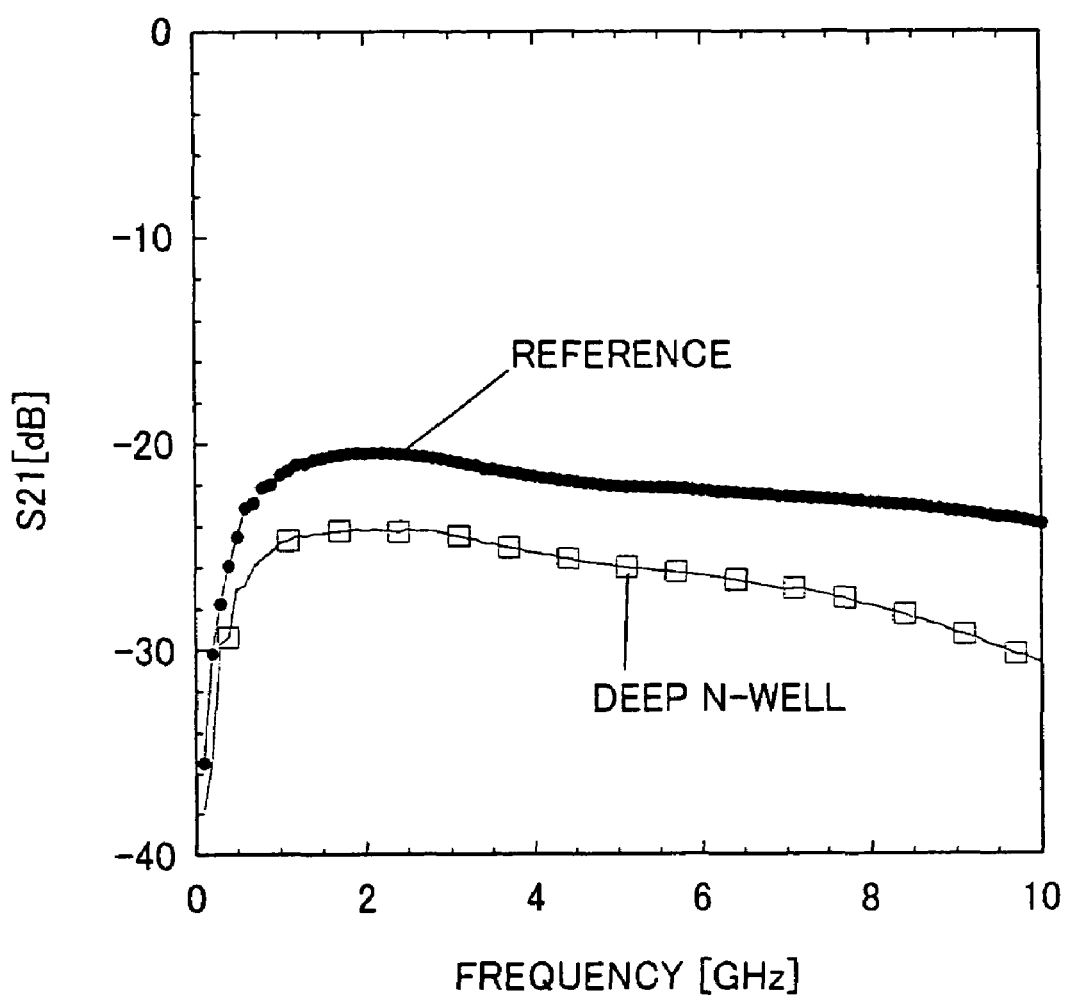
FIG. 14 is a graph illustrating effects of the input-output connectivity S21 in case a deep N-well is provided.

FIG. 4 illustrates effects of the metal isolation fence of the present invention. In FIG. 4, the metal isolation fence is used in a test structure that is identical to the structure of FIG. 12 (that is, the structure in which the spiral inductor is surrounded by the metal fence 20). As a result, an input-output connectivity S21 is reduced by approximately 20 dB as compared with a conventional pattern in which no metal isolation is provided. In general, S parameters are based on propagation of electromagnetic waves. Among the S parameters, in this case the S21 indicates isolation. The lower the S21 is, the better the isolation is, and the smaller an influence of the substrate crosstalk is.

A height of the metal fence as a whole may be equal to or higher than the element that generates the electromagnetic field. The number of layers of the metal wire layers may be determined according to a design. Moreover, a thickness of one layer, a height of the vias, and a diameter of the vias may be determined according to a process.

In the arrangement of FIG. 1, the metal fence, which is the metal wire layers laminated, may be changed as appropriate. The effect of the fence for decreasing electromagnetic coupling with an adjacent circuit block depends on the number of the metal wire layers laminated.

Figure 5:
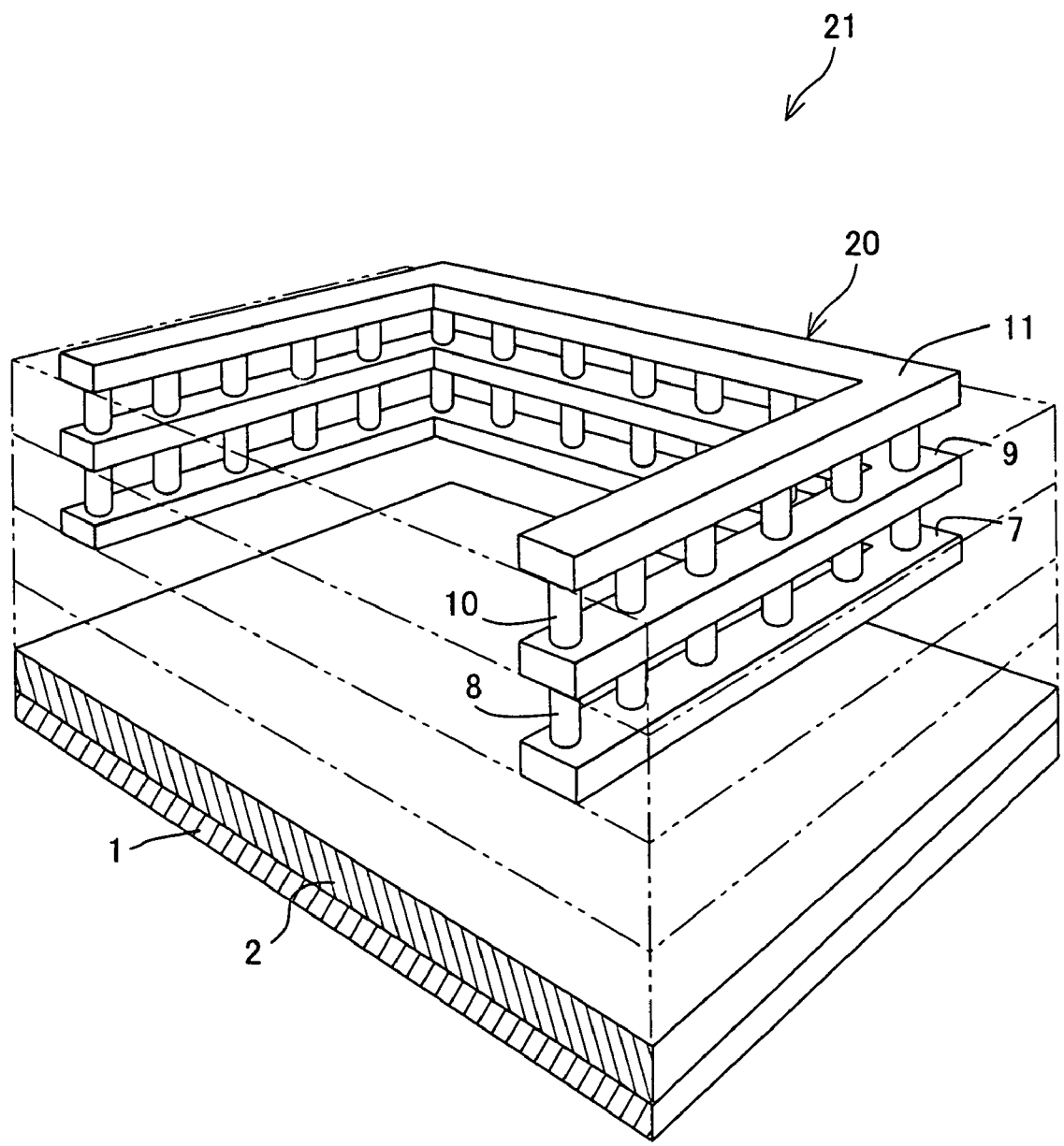
FIG. 5 is a perspective view illustrating another example of the arrangement of the metal fence in the integrated circuit of the present invention.

If (i) the circuit block is a high-frequency device, and (ii) in order to prevent, for example, deterioration of properties caused by a parasitic capacitance with the substrate, the circuit block surrounded (i.e. the element that generates the electromagnetic field) is made of a top layer of metal wire layers, it is more effective to provide a top layer on top of the metal wire layers of the metal fence, rather than providing the guard ring 3 (which is made of a diffusion layer) and a bottom metal wire layer (a bottom layer of the metal wire layers of the metal fence). That is, the height of the metal wire layers needs to be equal to or higher than the element that generates the electromagnetic field. FIG. 5 illustrates a structure of the metal isolation fence in which the guard ring 3 (which is made of a diffusion layer) and the bottom metal wire layer are not provided.

FIG. 6 is a summary of an experimental result showing the input-output connectivity S21 (dB) between two spiral inductors that are, as described above, made on the top layer of the metal wire layers. Here, the two spiral inductors are at a 100 $\mu$m-distance from each other. One of the two spiral inductors is surrounded by a metal fence made of different metal wire layers (a first metal wire layer to a fourth metal wire layer).

The first metal wire layer, the second metal wire layer, the third metal wire layer, and the fourth metal wire layer are provided in this order from an opposite side of a surface. The wire metal layer that is the closest to the substrate is the first metal wire layer. "A" and "B" indicate that the metal wire layer is provided. A blank section indicates that the metal wire layer is not provided. "A" is used if the metal wire layers are provided from a side of the fourth metal wire layer, and "B" is used if the metal wire layers are provided from a side of the first metal wire layer.

Figure 7:
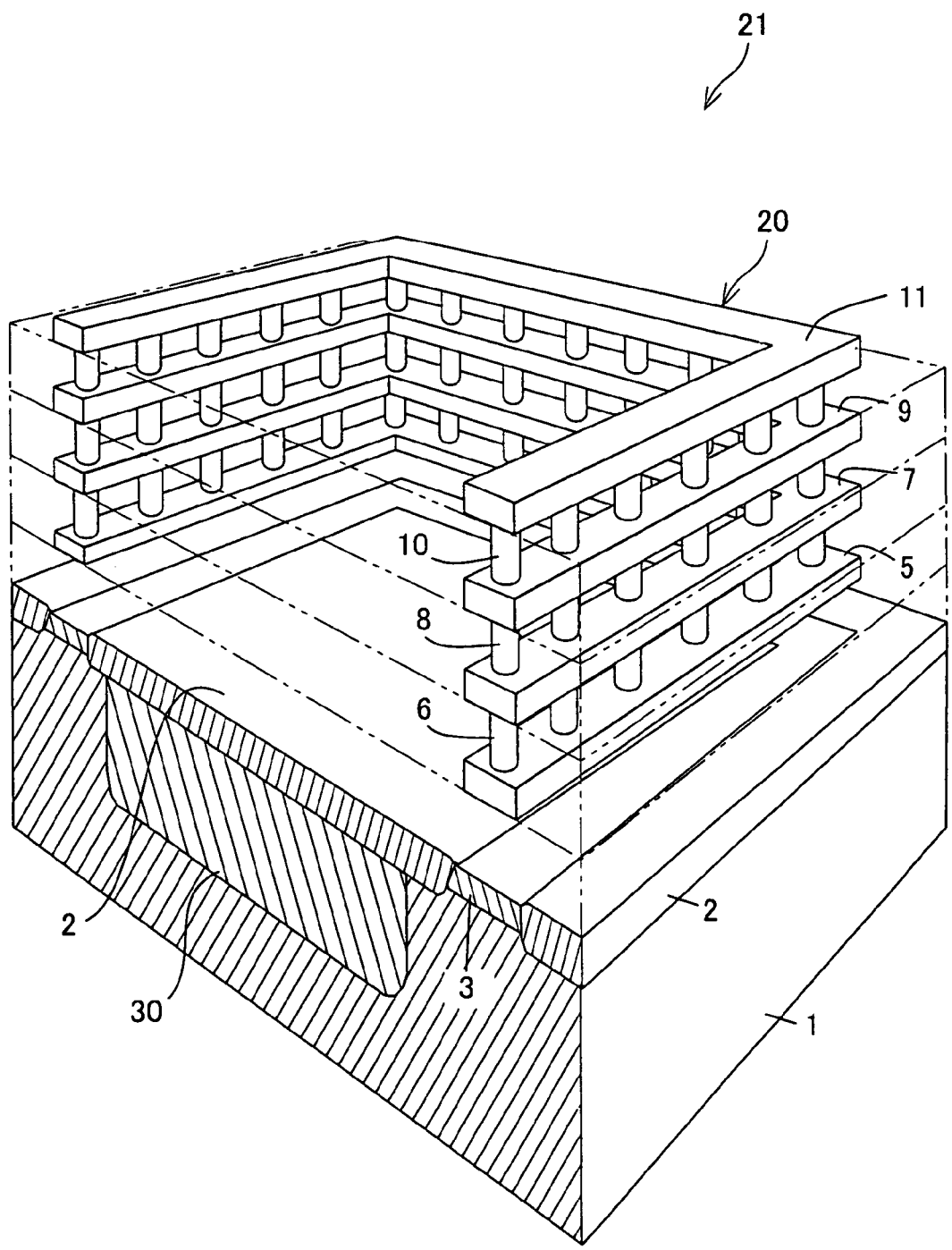
FIG. 7 is a perspective view illustrating still another example of the arrangement of the metal fence in the integrated circuit of the present invention.

As shown in FIG. 7, if an N-well 30 (a second diffusion layer) is provided below the circuit block surrounded by the metal fence 20, the effects of the electromagnetic isolation are further improved, especially in case of a high frequency.

An area of the N-well 30 is equivalent (e.g. equal) to an area surrounded by the metal fence 20 (i.e. an area of the circuit block).

In FIG. 7, the N-well is provided below the circuit block, and the substrate is a Psub. However, it may be so arranged that provided below the circuit is a P-well, and that the substrate is an Nsub.

Figure 8:
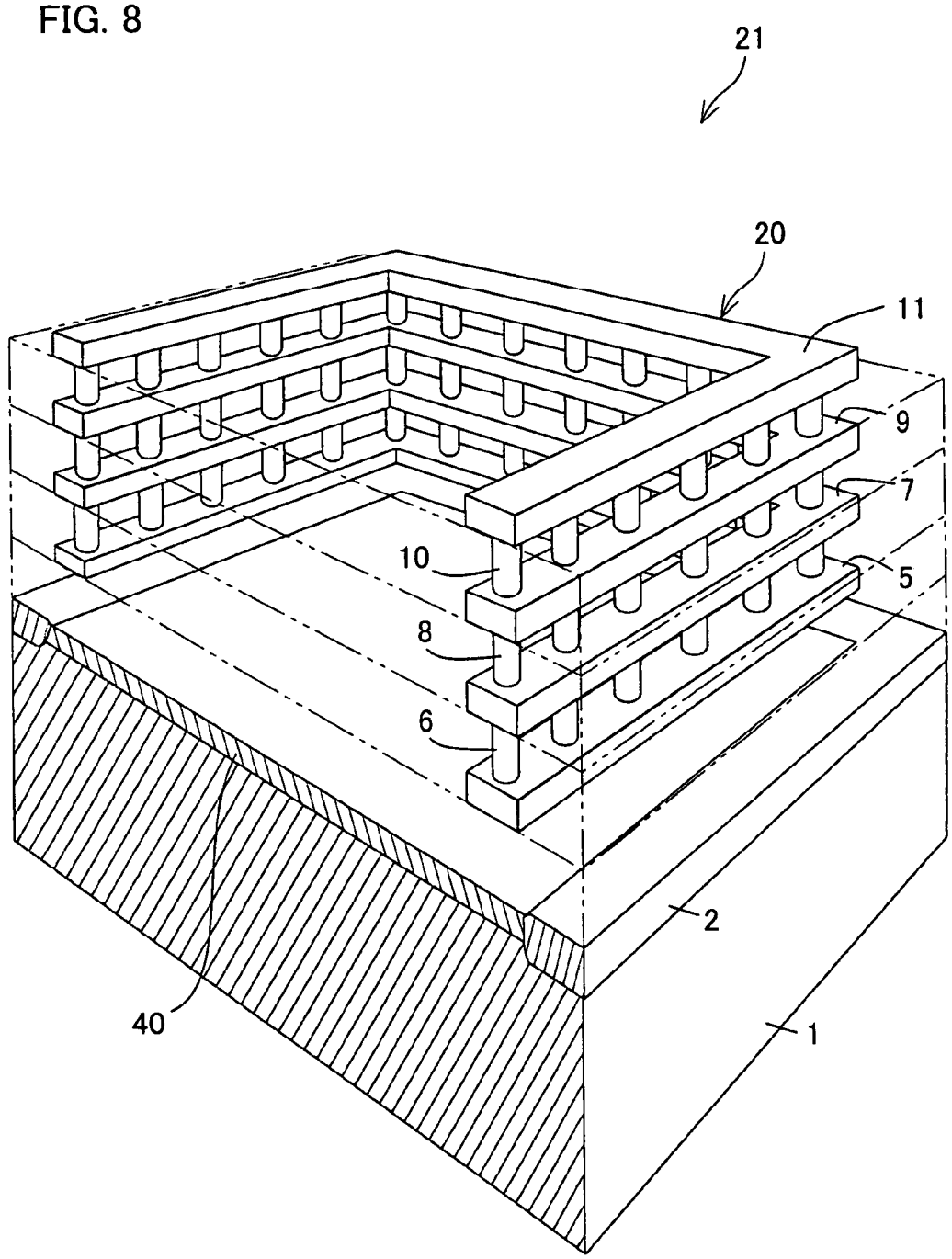
FIG. 8 is a perspective view illustrating yet another example of the arrangement of the metal fence in the integrated circuit of the present invention.

Furthermore, as a variation example of the basic structure, the electromagnetic isolation may be combined with a low-resistance layer 40. In this case, a conductivity type of the low-resistance layer 40 is identical to that of a substrate region. The low-resistance layer 40 is connected to a fixed potential, as shown in FIG. 8. The fixed potential is a Vdd or a GND, and is connected by a metal wire. The low-resistance layer 40 is made of a high-conductivity salicide diffusion layer or a silicidized polysilicon layer. This structure may be adopted in case the circuit block surrounded is not mounted within the substrate, such as a case of the spiral inductor.

Moreover, a size d (a geometric mean of the size of an area, such as a length of any of the sides when the area is a square) of the circuit region to be protected (the circuit region surrounded) and an area (Area) of the circuit region satisfy $$d = Area^{1/2}.$$

Moreover, the structure of the electromagnetic isolation fence depends on the operating frequency (that is, the wavelength $\lambda = c/f$). The equation on d is satisfied when the circuit region to be protected (the circuit region surrounded) is a quadrate, for example. However, the equation on d is also satisfied when the circuit region to be protected (the circuit region surrounded) is a circle. Whether the circuit region is a quadrate or a circle does not make much difference as to a value of d. If the circuit region is a circle, the metal fence is formed in a circular shape. In this case, the size d is approximately a diameter of the circle.

If $d \leq \lambda/8$, electromagnetic radiation does not come in nor come out of the metal fence. As a result, a cover metal at a bottom or at a top is not required, unlike the conventional example of the patent publication 2.

In case of an IC using an oxidized film as a dielectric layer, if (i) $c \approx 1.5 \times 10^{10}$ cm/s, f=5 GHz, and $\lambda \approx 3$ cm, and (ii) d=350 ($\mu$m), where d is a size of a circuit region of a circuit block, it is possible to suppress electromagnetic coupling by simply surrounding the circuit block, without providing a metal shield layer at a top or at a bottom.

Figure 9:
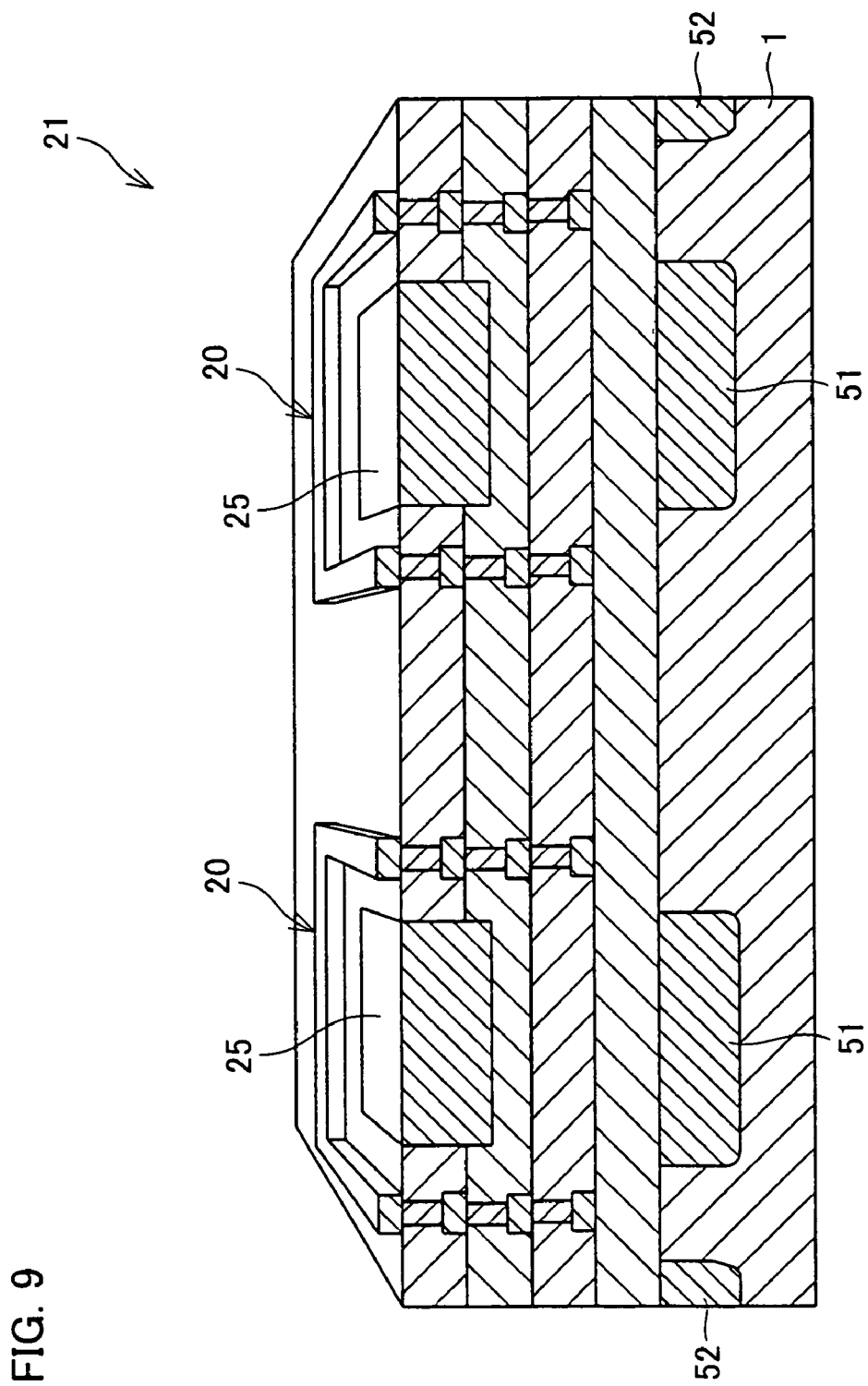
FIG. 9 is a perspective view illustrating further example of the arrangement of the metal fence in the integrated circuit of the present invention.

Furthermore, the coupling between circuit blocks in the high-frequency domain mainly occurs via the substrate. In order to decrease the substrate coupling, the metal isolation fence is combined with a circuit constituent (e.g. a spiral inductor, a capacitor, or the like) that is provided in a silicon region. In this region, as shown in FIG. 9, simply providing an N-well 51 and a P-well 52, which are normal medium-doped wells (tabs), has a sufficient suppressing effect. That is, as shown in FIG. 9, even though the N-well 51 and the P-well 52 are medium-doped wells, and between the circuit blocks is not doped, a substrate resistance is increased if Psub is used as the substrate 1. As a result, it is possible to sufficiently suppress substrate noises.

Thus, a silicon region between the circuit blocks 25 is a substrate having a high resistivity. Therefore, an impedance of the substrate coupled is high. As a result, the coupling between circuit blocks in the high-frequency domain is decreased.

Figure 10:
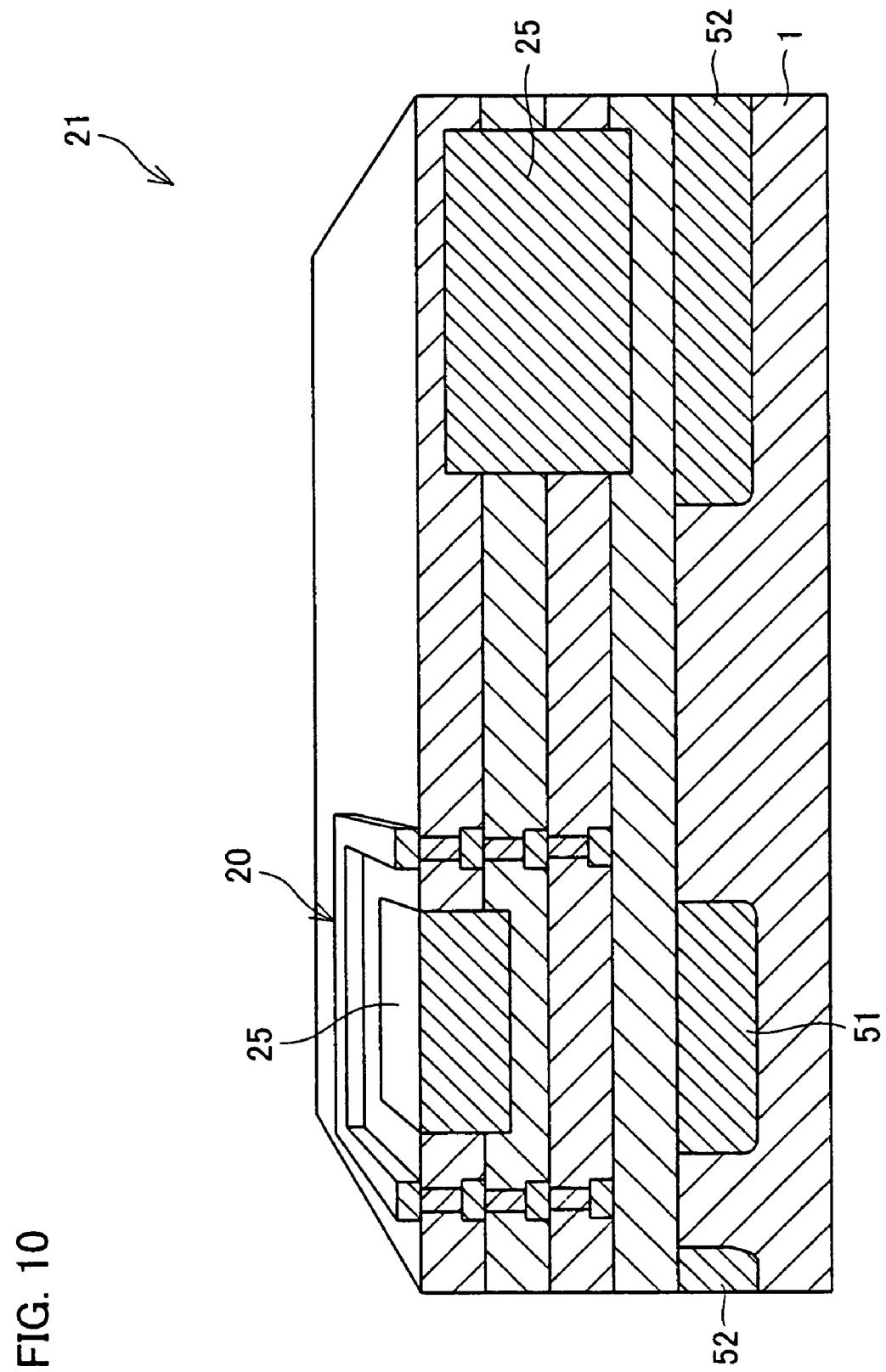
FIG. 10 is a perspective view illustrating still further example of the arrangement of the metal fence in the integrated circuit of the present invention.
Figure 11:
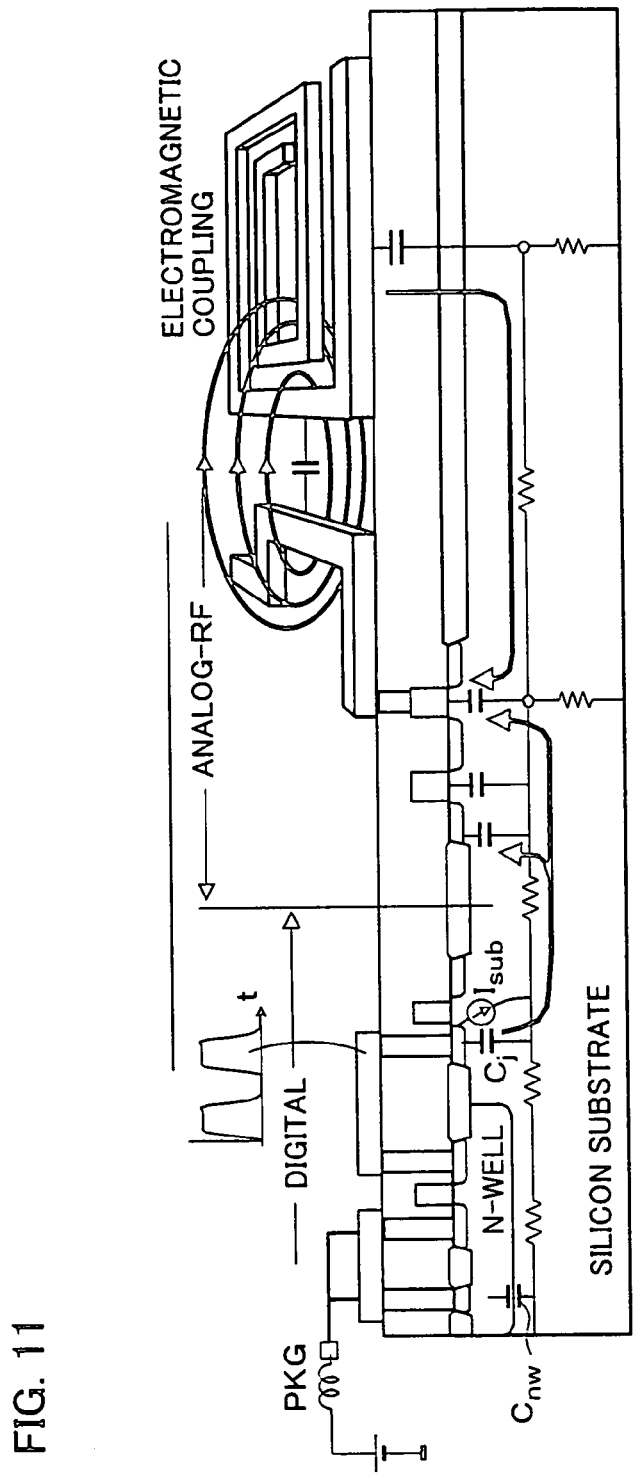
FIG. 11 is a figure illustrating mutual interference that occurs in case analog/digital devices are mounted on the same chip.

Thus, it may be so arranged that a region between a plurality of elements (the circuit blocks 25) each of which has the metal fence structure is the substrate 1. Moreover, as shown in FIG. 10, it may be so arranged that a region between an element having the metal fence structure and another element having no metal fence structure is the substrate 1.

The picked fence in the patent publication 2 is a lamination of metal wire layers surrounding a circuit or an element in a lateral direction. At least at the top of or under the circuit or the element, there is a two-dimensional surface made of a metal wire layer. Moreover, in the patent publication 2, the lamination of metal wire layers is connected with a diffusion layer of the substrate.

In contrast, it is not necessary that a metal stack structure of the present invention is connected to a diffusion layer of the substrate. Therefore, it is possible to adopt a simple design. Moreover, because the metal fence of the present invention surrounds the circuit or the element so that a lateral-direction size d is given by $d < \lambda/8$, it is not necessary to use a top metal shield layer.

As described above, the present invention effectively suppresses magnetic, capacitive, and substrate coupling between RF circuit blocks. The metal electromagnetic isolation technology requires no special process. As a result, the metal electromagnetic isolation technology is compatible with the standard IC process. Moreover, effective electromagnetic isolation is attained. That is, even if a distance between critical RF circuit blocks is short, it is possible to attain the electromagnetic isolation. As a result, it is possible to reduce a chip size.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
   a target element; and
   a metal fence provided so as to surround the target element,
   the metal fence including (i) a lamination of metal wire layers for forming an electromagnetic isolation structure and (ii) a plurality of vias for connecting the metal wire layers with each other,
   the metal fence satisfying $d \leq \lambda/8$, $WF \geq 5\delta$, and $L \leq \lambda/20$, where $\delta$ is a skin depth of an electromagnetic wave, c is a velocity of light, f is an operating frequency of the integrated circuit, d= Area$^{1/2}$ (where Area is an area of a circuit region to be protected), WF is a surrounding-line width of the metal fence, L is an interval between the vias, and $\lambda=c/f$ is a wavelength of a signal.

2. An integrated circuit as set forth in claim 1, further comprising:
   a guard ring provided right under the metal fence, the guard ring being made of a first diffusion layer whose conductivity type is identical to a conductivity type of a substrate,
   the guard ring being connected with a fixed potential,
   the guard ring being electrically isolated from the metal fence.

3. An integrated circuit as set forth in claim 1, further comprising: a well provided below the target element, the well being connected with a substrate.

4. An integrated circuit as set forth in claim 1, further comprising:
   a low-resistance layer provided below the target element, a conductivity type of the low-resistance layer being identical to a conductivity type of a substrate,
   the low-resistance layer being connected with a fixed potential,
   the low-resistance layer being electrically isolated from the metal fence.

5. The integrated circuit as set forth in claim 4, wherein: an area of the low-resistance layer is equivalent to an area surrounded by the metal fence.

6. The integrated circuit as set forth in claim 5, wherein: the low-resistance layer is a salicide diffusion layer.

7. The integrated circuit as set forth in claim 5, wherein: the low-resistance layer is a silicidized polysilicon layer.

8. The integrated circuit as set forth in claim 1, wherein: between a plurality of elements each of which has the metal fence is a substrate.

9. The integrated circuit as set forth in claim 1, wherein: between an element having the metal fence and another element having no metal fence is a substrate.

10. The integrated circuit as set forth in claim 1, wherein: the target element is an element that generates an electromagnetic field in the integrated circuit.

11. The integrated circuit as set forth in claim 10, wherein: the target element is a high-frequency device.

12. The integrated circuit as set forth in claim 11, wherein: the target element is a spiral inductor.

13. The integrated circuit as set forth in claim 1, wherein: the metal fence is grounded.

14. The integrated circuit as set forth in claim 1, wherein: a distance SF between the metal fence and the target element is given by SF>25 $\mu$m.

15. The integrated circuit as set forth in claim 1, wherein:
    the metal fence is AlCu;
    a thickness of each metal wire layer of the metal fence is 0.6 $\mu$m to 1.5 $\mu$m; and
    the WF is given by WF>5 $\mu$m.

16. The integrated circuit as set forth in claim 1, wherein: a height of the metal fence as a whole is equal to or higher than a level of the target element.

17. The integrated circuit as set forth in claim 1, wherein: a top and a bottom of the target element are not covered with the metal fence, so that the top and the bottom of the target element are exposed.

* * * * *